United States Patent [19]
Szajda

[11] Patent Number: 5,952,892
[45] Date of Patent: Sep. 14, 1999

[54] LOW-GAIN, LOW-JITTER VOLTAGE CONTROLLED OSCILLATOR CIRCUIT

[75] Inventor: Kenneth S. Szajda, Waltham, Mass.

[73] Assignee: LSI Logic Corporation, Milpitas, Calif.

[21] Appl. No.: 08/939,586

[22] Filed: Sep. 29, 1997

[51] Int. Cl.[6] .............................. H03B 5/24; H03L 7/099; H03L 7/18
[52] U.S. Cl. .......................... 331/57; 331/34; 331/177 R; 331/179; 331/10; 331/8; 327/157; 375/376; 455/260
[58] Field of Search ........................... 331/34, 57, 177 R, 331/179, 185, 186; 375/376; 455/260

[56] References Cited

U.S. PATENT DOCUMENTS

| | | | |
|---|---|---|---|
| 4,965,535 | 10/1990 | Neuman | 331/179 X |
| 5,142,249 | 8/1992 | Hirotomi | 331/57 |
| 5,175,512 | 12/1992 | Self | 331/57 |
| 5,208,557 | 5/1993 | Kersh, III | 331/57 |
| 5,272,453 | 12/1993 | Traynor et al. | 331/57 |
| 5,349,311 | 9/1994 | Mentzer | 331/179 X |
| 5,416,446 | 5/1995 | Holler, Jr. et al. | 331/57 |
| 5,446,417 | 8/1995 | Korhonen et al. | 331/57 |
| 5,477,198 | 12/1995 | Anderson et al. | 331/177 R |
| 5,563,553 | 10/1996 | Jackson | 331/57 |
| 5,629,652 | 5/1997 | Weiss | 331/108 B |
| 5,686,867 | 11/1997 | Sutardja et al. | 331/57 |

OTHER PUBLICATIONS

Self, P.W.; "High SpeedPower Supply Independent CMOS Voltage Controlled Ring Oscillator with Level Shifting Circuit"; U.S. Ser. No. 843,703; original Fig. 2, Dec. 1992.

Primary Examiner—David Mis
Attorney, Agent, or Firm—Alexander C. Johnson; Wayne P. Bailey

[57] ABSTRACT

A low-gain, low-jitter VCO circuit implemented in CMOS provides center frequency adjustment to overcome process variations. Further, noise immunity is improved by using a separate feedback loop to provide the nominal current biasing for the oscillator chain. This feedback loop coarsely sets the center frequency. The actual control of the oscillation frequency is achieved by a second current source, whose output is added to the nominal bias current to provide a total bias to the oscillator. This second current source "fine tunes" the oscillator frequency responsive to a control signal. Because two separate current sources are used, the circuit can realize a high oscillation frequency with a low VCO gain. Another feature provides for adjusting the center frequency in response to a digital input word provided via external pins, or from internal logic or memory. The center frequency thus can be calibrated by measurement at the time of manufacture, or changes later by the end user or by other circuitry.

21 Claims, 7 Drawing Sheets

High gain case: Even with shift, center frequency fcenter1 attainable by use of Vc2

LOW-GAIN, LOW-JITTER VOLTAGE CONTROLLED OSCILLATOR CIRCUIT

BACKGROUND OF THE INVENTION

The voltage controlled oscillator ("VCO") circuit is well-known in electrical engineering for various applications. Frequently, a VCO is used in a phase-locked loop ("PLL") circuit to provide an output voltage signal having a predetermined frequency, or a frequency that varies in response to an external input. For example, PLLs are commonly used in digital (serial) data communications receivers for tracking the frequency of an incoming data signal.

The nominal oscillation frequency of a VCO is known as its center frequency. A scale factor relating a change in output frequency to a change in input (control) voltage is the VCO gain, generally expressed in MHz per volt. Jitter of a VCO can be generally defined as the instantaneous variation in output frequency from the desired output frequency, and is usually a result of noise on the voltage control input terminal and noise coupled through the power supplies.

Conventionally, CMOS VCO's are simple current-controlled ring oscillators formed as a chain of inverters. The output frequency control is realized by a programmable MOS current source that limits the current available to the inverter chain, which in turn affects the propagation delay through each inverter. This causes a change in the oscillation frequency. A simplified schematic illustrating the traditional VCO circuit is shown in FIG. 1.

A primary problem with the conventional VCO design is that the VCO gain is usually very high, which makes the circuit more susceptible to noise. Additionally, the lack of noise immunity results in high output jitter. Conventional VCO designs are especially poor at realizing high nominal output frequency with a low VCO gain, since the tranconductance of the controlling current source is inherently coupled to its nominal DC current. High oscillation frequency requires high nominal bias current, while low gain requires low transconductance (which typically requires low current). The importance of this problem is growing because of demands for ever-higher bandwidth in communications applications, networking, telecom, internet, etc.

Another disadvantage of known VCO designs is that the nominal process variations that occur in fabrication of the VCO circuit cause errors in the nominal center frequency of the oscillator. This necessitates a higher VCO gain since the circuit must be able to compensate for the shift in center frequency by altering the nominal control voltage. To illustrate, FIG. 2A is an illustrative plot of frequency versus control voltage with relatively high gain. Curve A shows the frequency versus voltage characteristic as designed. Curve B shows the same characteristic shifted as a result of process variation. As illustrated, the desired center frequency Fcenter1 can still be achieved by use of shifting the control voltage to VC2. FIG. 2B, on the other hand, illustrates the low-gain case. Again, curve A shows the frequency characteristic as designed, while curve B shows the frequency characteristic shifted due to process variation. Here, there is no control voltage between the limits, Vlow and Vhigh, which can produce the designed center frequency, Fcenter1, on the shifted curve B. Thus, the prior art forces the designer to increase the VCO gain, albeit at the expense of noise immunity and jitter.

SUMMARY OF THE INVENTION

In view of the foregoing background, it is an object of the present invention to realize in CMOS a low-gain, low-jitter VCO.

Another object of the present invention is to provide an improved VCO with center frequency adjustment to overcome process variations.

It is a further object of the present invention to improve noise immunity in a VCO circuit.

A still further object of the invention to provide for high-frequency operation of a low-gain, low-jitter VCO circuit.

Yet another object is to improve upon known serial data communications clock and data recovery methods and apparatus.

One aspect of the present invention solves the problem of achieving high-oscillation frequency with low gain by decoupling the biasing of the inverter chain from the actual frequency control. This is accomplished by using a separate feedback loop to provide the nominal current biasing for the oscillator chain. This feedback loop coarsely sets the center frequency. The actual control of the oscillation frequency is achieved by a second current source, whose output is added to the nominal bias current to provide a total bias to the oscillator. This second current source "fine tunes" the oscillator frequency responsive to a control signal. Because two separate current sources are used, the circuit can realize a high oscillation frequency with a low VCO gain: the bias feedback circuit provides a large "nominal" current to set a high center frequency, and the second current source provides a much smaller, more finely controlled "perturbation" current that is used to finely adjust the output frequency. Thus, VCO gains (the change in output frequency as a function of control voltage change) substantially lower than the conventional approach, can be realized even with very high nominal center frequencies.

Another aspect of the present invention is to address the problem of center frequency drift due to manufacturing variations. This is addressed using a center frequency adjustment circuit—similar to a digitally programmable current sink. The user of the VCO applies a digital input word to the center frequency adjustment circuit as appropriate to center the VCO at the desired frequency. This digital control word for adjusting the center frequency can be generated internally, stored in a memory, or it can be determined and applied externally during a calibration process at the time of manufacture. It can even be changed by an end user subsequent to manufacture as required in various applications. The present invention allows a wide range of center frequency variation, without sacrificing accurate fine tuning the circuit responsive to the control voltage in normal operation.

Another feature of the present invention is improvement in the jitter problem. This is achieved by implementing low VCO gain, and by employing another feedback loop in the bias circuit to compensate for power supply voltage variation.

Thus one aspect of the invention is directed to a method of controlling an output signal frequency of a ring oscillator. The new method includes the steps of establishing a predetermined nominal center frequency of oscillation of the ring oscillator by providing a bias current to the ring oscillator using a first current source; and, controllably tuning the output signal frequency by providing additional bias current to the ring oscillator using a second current source, wherein the second current source but not the first current source is variable in response to a frequency control signal. In a presently preferred embodiment the bias feedback loop circuit has a loop gain approximately on the order of 10 to 100; whereas the VCO gain (responsive to the frequency control signal) is on the order of 1 to 10 MHz/Volt.

Another aspect of the invention includes a VCO circuit comprising: a ring-oscillator made up of a serial chain of inverter circuits to provide an oscillating output signal having a desired frequency; a first adjustable current source coupled to the ring oscillator inverter circuits to provide primary power supply biasing so as to establish oscillation of the output signal at approximately a selected center frequency; and a second adjustable current source also coupled to the ring oscillator inverter circuits to augment the primary biasing for tuning the output signal frequency in response to a control input signal.

A further aspect of the present invention implements a digitally programmable current sink connected to the output of the first adjustable current source so as to provide a programmable load for varying the bias current to the ring oscillator. This feature provides for adjusting the center frequency in response to a digital input word provided to the programmable current sink. The input word can be provided via external pins, or from internal logic or memory. The center frequency thus can be calibrated by measurement at the time of manufacture. According to this aspect of the invention, the center frequency is adjusted by measuring a center frequency of the ring oscillator; determining an adjustment load current necessary for changing the center frequency to a desired center frequency; and then applying to the programmable current source a selected digital input word corresponding to the adjustment load current; whereby a desired center frequency is attained while overcoming fabrication process variations.

The foregoing and other objects, features and advantages of the invention will become more readily apparent from the following detailed description of a preferred embodiment which proceeds with reference to the drawings.

DETAILED DESCRIPTION OF A PREFERRED EMBODIMENT

Figure 1:
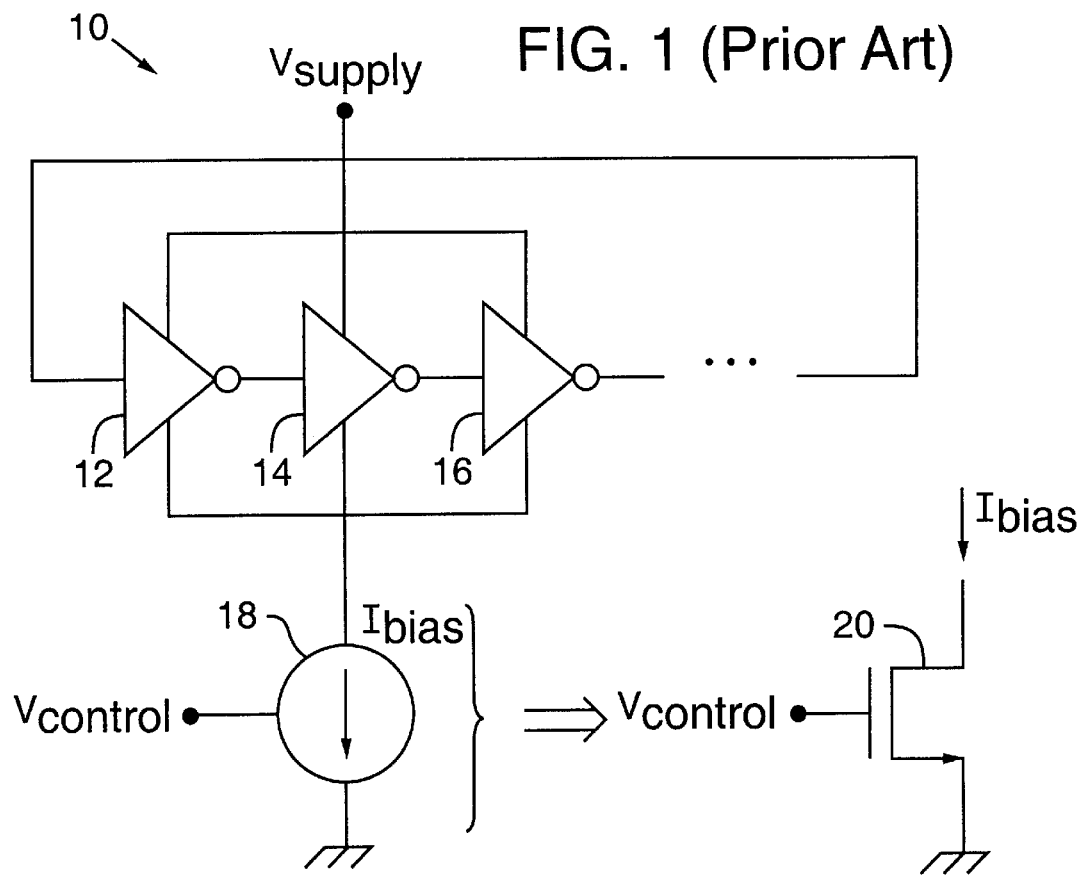
FIG. 1 is a simplified schematic diagram of a conventional VCO circuit.

FIG. 1 is a simplified schematic diagram of a conventional VCO circuit. The VCO circuit essentially comprises a ring oscillator 10, formed of a chain of serially-connected invert-ers 12, 14, 16. Although only three inverters are shown, the chain can have any odd number of inverters. An adjustable bias current source 18 controls the supply current $I_{bias}$ to the inverters responsive to an input voltage $V_{control}$. As illustrated, the current source can be implemented as an MOS device 20. Variation of the supply or bias current changes propagation delay in the inverters, and hence the oscillation frequency of the ring. As described in the background, VCOs of this type suffer from poor noise immunity, jitter and center frequency drift.

Figure 3A:
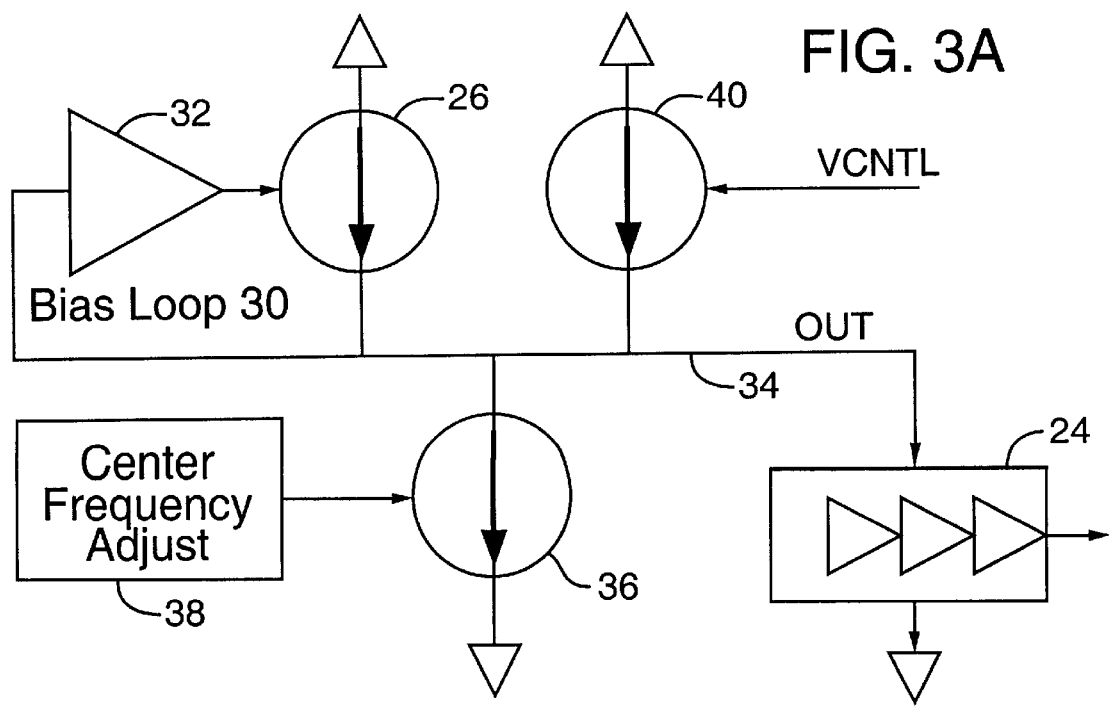
FIG. 3A is a simplified block diagram of an improved VCO circuit according to the principles of the present invention.
Figure 2A:
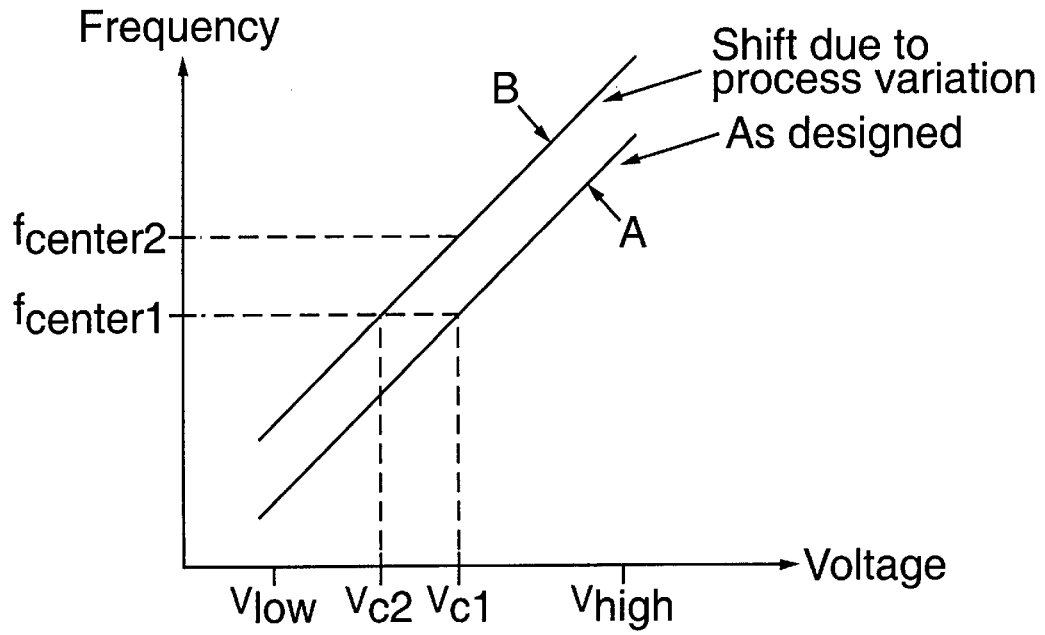
FIG. 2A is a plot of frequency versus control voltage for a VCO of the type illustrated in FIG. 1 and having a high gain.
Figure 2B:
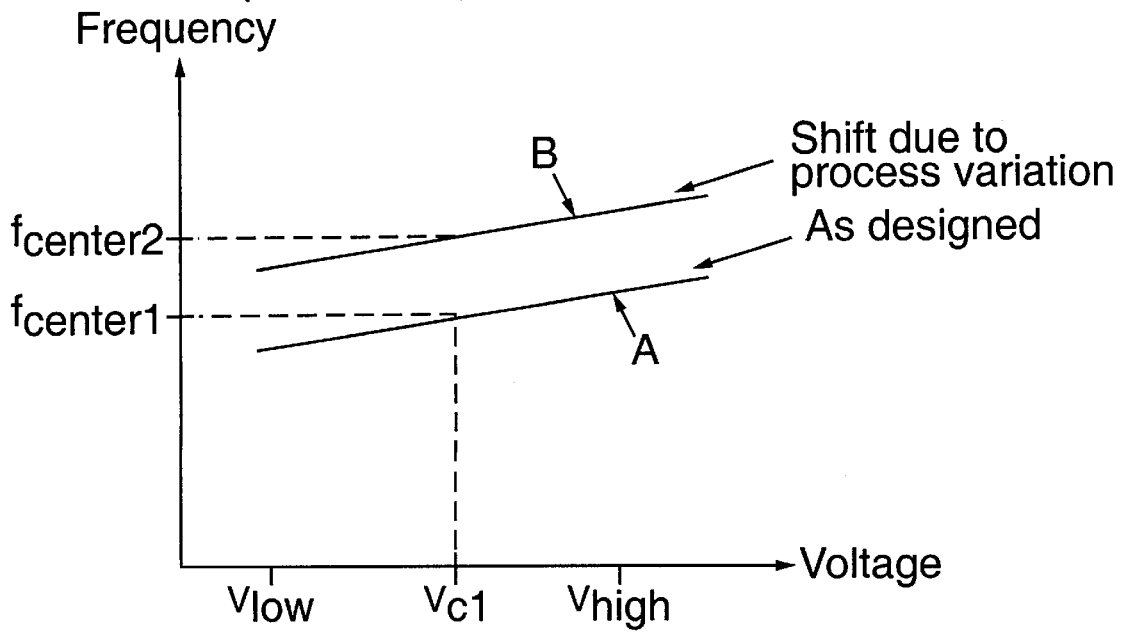
FIG. 2B a plot of frequency versus control voltage for a VCO circuit of the type illustrated in FIG. 1 and having a relatively low gain.
Figure 7:
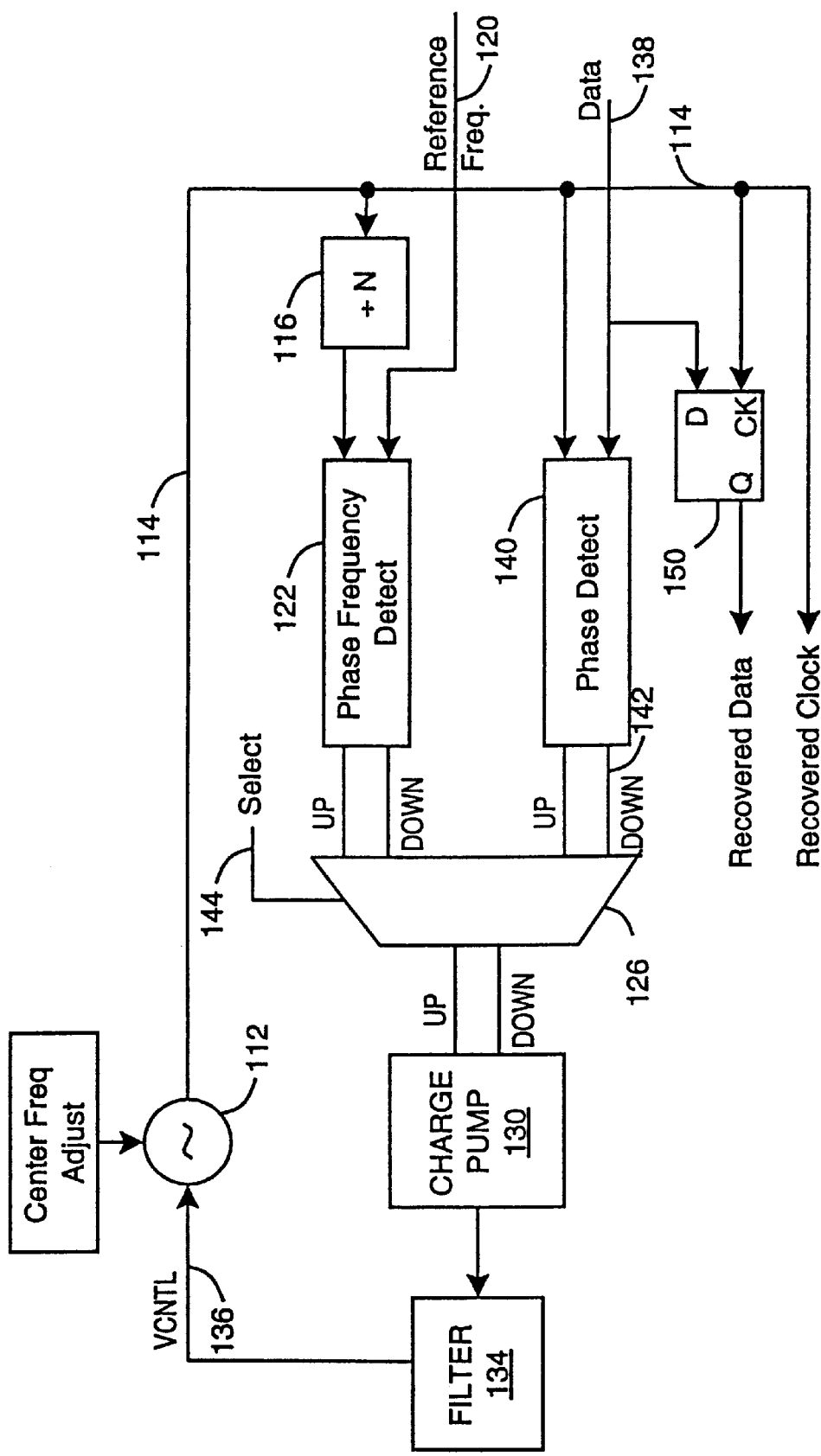
FIG. 7 is a functional block diagram of a serial receiver clock and data recovery circuit that incorporates an improved VCO according to the invention.

FIG. 3A is a simplified block diagram introducing certain aspects of the present invention. In FIG. 3A, an improved VCO circuit includes a conventional ring oscillator 24. The output signal OUT provides power supply bias current to the ring oscillator. The bulk of this supply current or bias current is provided by a first adjustable current source 26. Current source 26 is part of a relatively high-gain biasing feedback loop 30, which includes amplifier 32. This biasing circuit provides a constant current out of the current source 26 and into node 34 (OUT) to supply bias current to the ring oscillator. A second adjustable current source 36 is controlled by a center frequency adjustment circuit 38 responsive to a digital input described later. The second current source 36 sinks a selected amount of current away from node 34 for adjusting the center frequency of oscillation. Finally, a third adjustable current source 40 sources additional current into node 34 in response to a control voltage VCNTL. This is the VCO control signal for adjusting frequency, for example in a PLL circuit as shown in FIG. 7. Current source 40 provides only a relatively small additional current to node 34 so as to provide small changes in the ring oscillator frequency. Thus the VCO gain is low. In a presently preferred design, the relative gain of the bias loop is 16 times the VCO gain although this particular figure is not critical.

Figure 3B:
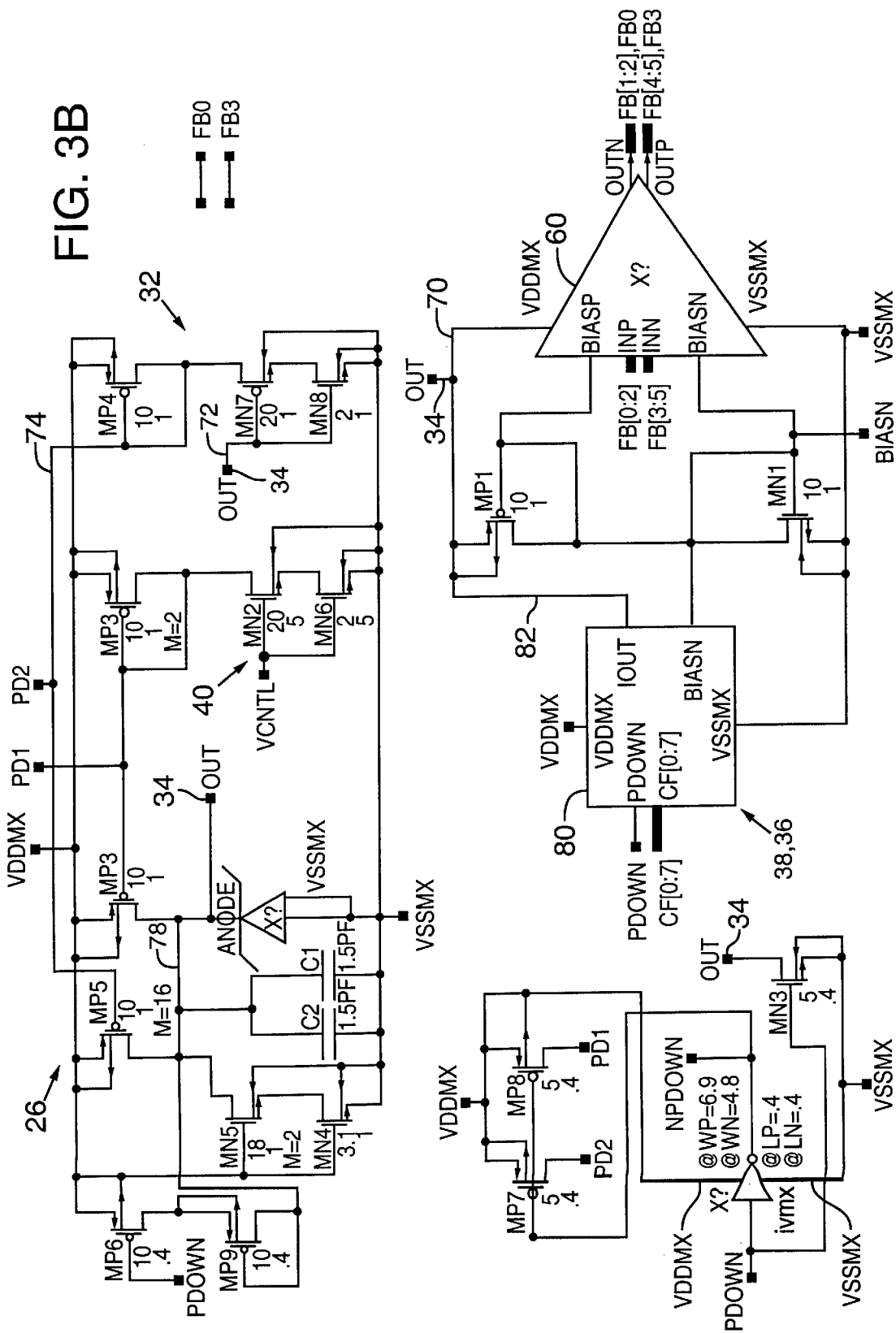
FIG. 3B is a detailed schematic diagram of an improved VCO circuit according to a presently preferred embodiment of the present invention.

Now the reader is directed to the schematic diagram of FIG. 3B to examine in greater detail a presently preferred embodiment of the foregoing concepts. Referring to FIG. 3B, a bias current loop (generally corresponding to loop 30 in FIG. 3A) is realized by devices MN7, MN8, MP4, MP5 and the "electronic Zener" circuit 50 described in more detail later. The signal "OUT" is the ring oscillator supply voltage regulated by the electronic Zener, and its current limited by the bias loop described, which provides its output current through device MP5. This OUT signal is used to supply power to the ring oscillator structure 60, shown in simplified form in the lower right portion of FIG. 3B. Note that lines 70, 72 and 78 in FIG. 3B are part of node OUT 34 in FIG. 3A and are electrically common.

More specifically, the bias loop feedback is provided by coupling the OUT signal at node 72 to the gates of devices MN7 and MN8. A current flowing through the channel of those devices in response to the OUT voltage also flows through device MP4 and is reflected by a voltage at the gate source of MP4, indicated as node 74 (PD2). Node 74 also is connected to the gate of transistor MP5 which in turn provides the output current to node 78. This feedback loop has substantial gain. For example, in a presently preferred embodiment, the mirroring devices MP4 and MP5 have the same size (channel width and length), but MP5 is formed of 16 such devices arranged in parallel. Accordingly, the output current at node 78 will be 16 times the current through device MP4. The current in MP4 is set by transistor MN7, whose current is responsive to the output voltage.

The frequency control circuit is formed by devices MN2, MN6, MP2 and MP3. These devices are arranged in a current mirroring configuration similar to the bias current feedback loop described above. However, it should be noted that the semiconductor devices are sized and scaled so that the current supplied by the frequency control circuit is substantially lower than the current supplied by the feedback biasing circuit. To illustrate, device MP2 comprises two transistors arranged in parallel, each having the same size as device MP3. Accordingly, the current flow responsive to the control input voltage VCNTL is divided in half in this current mirror. This is compared to the bias current loop described above which has a ratio of 16 (compare MP4 to MP5), so that the overall ratio as between the bias current loop and the frequency control circuit is 32. These numbers are merely illustrative of the presently preferred embodiment and are not intended to be limiting. The specific circuit design, currents, voltages, gain ratios and the like will vary according to various different target processes, intended frequencies of operation, and the like. In any event, it can be observed that changes in the control input voltage VCNTL will result in small changes in the current available at the OUT node. This causes very small changes in the ring oscillator frequency, i.e., the low VCO gain.

Figure 4:
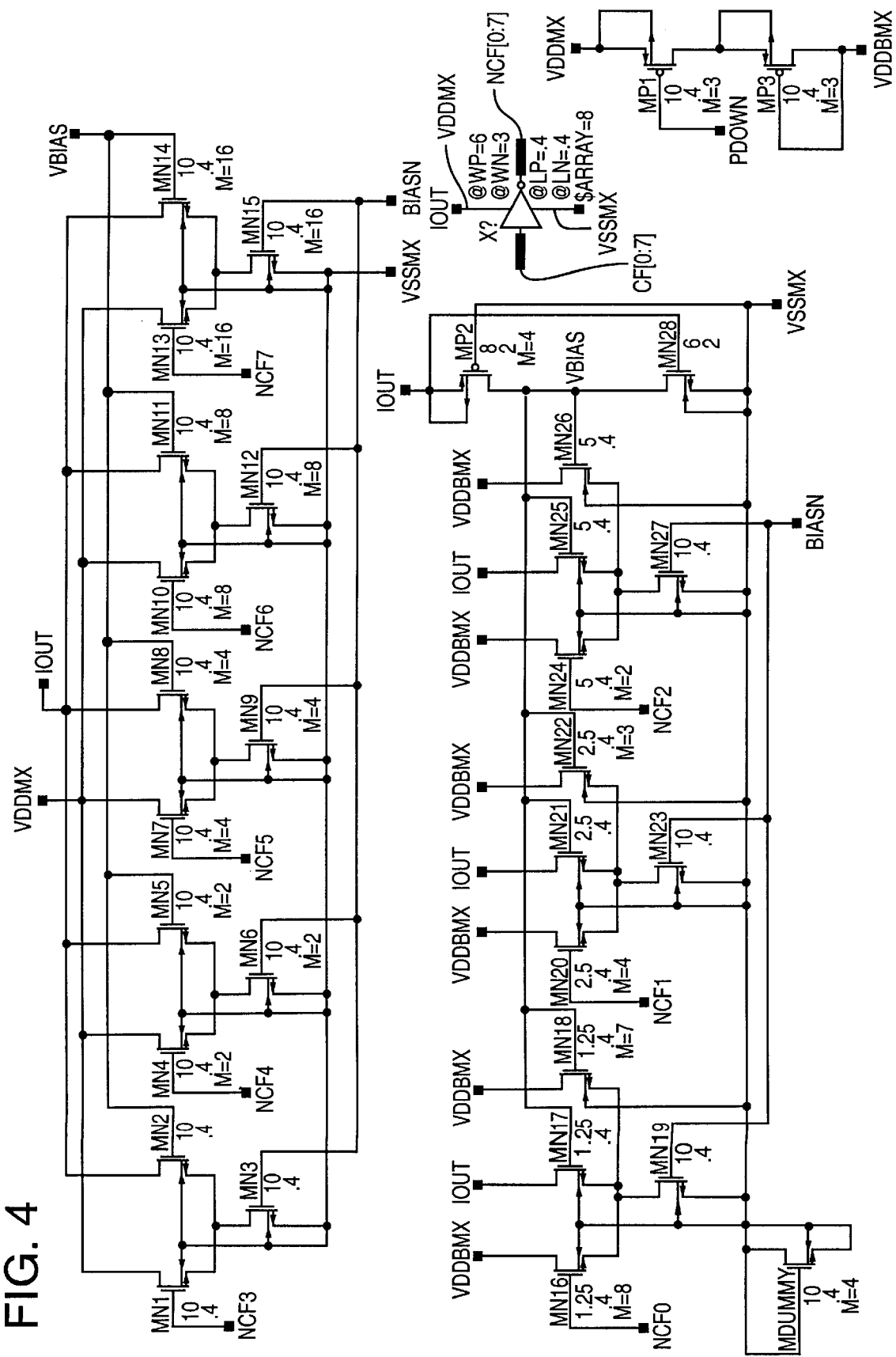
FIG. 4 is a schematic diagram showing a center frequency adjustment circuit of the VCO of FIG. 3 in greater detail.

Center frequency adjustment is accomplished using a center frequency selection circuit 80 (corresponding to 38 and 36 in FIG. 3A) in combination with the bias loop as described. The center frequency adjustment circuit is illustrated in greater detail in FIG. 4. Referring now to FIG. 4, the center frequency adjustment circuit essentially comprises a programmable current source, i.e., a digital to analog converter that converts a digital word to a current. In the presently preferred embodiment, a center frequency input word CF[0:7], i.e., eight bits, provides an input to the selection circuit of FIG. 4. These digital input bits are inverted so as to form inverted center frequency bits NCF [0:7], respectively.

Each input bit controls a corresponding current source in the center frequency adjustment circuit, all of which are connected to a common output node, IOUT. For example, in the upper left of FIG. 4, input bit NCF3 controls a current source comprising transistor devices MN1, MN2 and MN3. MN3 provides a stable bias current, and MN1, when turned off by NCF3 being low, steers the current in MN3 through MN2 which is connected to the output node IOUT. Similarly, another input bit NCF4 controls a current source comprising transistors MN4, MN5 and MN6. When NCF4 is low, MN5 is turned on so as to sink additional current at the output node IOUT. The reader will observe that each of the other input bits NCF5, NCF6, NCF7, NCF0, NCF1 and NCF2 are each connected to a corresponding current source which will contribute to the output current IOUT when the corresponding input bit CF[n] is asserted. Accordingly, in operation, the digital input word CF[0:7] determines the value of the output current IOUT.

Binary weighting of the input bits is accomplished by appropriate scaling in each of the individual current sources in the circuit of FIG. 4. For example, bit NCF3 controls transistors MN1 and MN2 which have geometries of length=0.4 units and width=10 units. By way of comparison, input bit NCF7 controls devices MN13 and MN14. Each of these devices is comprised of a series of 16 individual devices (M=16), each having the same 10×0.4 geometry. Accordingly, NCF7 contributes 16 times as much current to IOUT as NCF3.

Next consider the individual current source control by input bit NCF1. Here, the current in device MN23 can be steered through devices MN21 and MN22, arranged in parallel. Only MN21 is connected to the output node IOUT, whereas MN22 is not. MN21 and MN22 incorporate the same size devices (width=2.5 and length=0.4), but MN22 consists of three such devices arranged in parallel (M=3). Accordingly, three-fourths of the total current induced in MN20 is "thrown away" by MN22. The remaining one-fourth of that current flows through MN21 from the output node IOUT. The result is that input bit NCF1 contributes one-fourth of the unit current as defined by input bit NCF3. By applying a similar strategy of parallel devices and scaled geometries, the other bits of the programmable current source are implemented. Operation of the device can be summarized in the following table in which the first column lists each of the digital input bits NCF[0:7]; W is channel width; L is channel length; M is the number of parallel devices in the corresponding current mirror; R is the ratio of output current to total mirror current (as explained above with reference to bit NCF1); and finally, IOUT in the table indicates the relative contribution of each bit to the total output current. The resulting adjustment circuit has resolution of one part in 128 for adjusting the output current. Of course, a greater or lesser number of bits can be implemented to achieve desired range and resolution of center frequency adjustment.

TABLE

Center Frequency Adjustment Current Source

| Input Bit | W | L | M | R | IOUT |
|---|---|---|---|---|---|
| NCF0 | 1.25 | 0.4 | 8 | 1/8 | 1/8 |
| NCF1 | 2.5 | 0.4 | 4 | 1/4 | 1/4 |
| NCF2 | 5. | 0.4 | 2 | 1/2 | 1/2 |
| NCF3 | 10. | 0.4 | 1 | 1 | 1 |
| NCF4 | 10. | 0.4 | 2 | 1 | 2 |
| NCF5 | 10. | 0.4 | 4 | 1 | 4 |
| NCF6 | 10. | 0.4 | 8 | 1 | 8 |
| NCF7 | 10. | 0.4 | 16 | 1 | 16 |

Referring again to FIG. 3B, capacitors C1 and C2 form an output filter at the output node. Devices MN4 and MN5 create another feedback loop that acts as a compensator for power supply noise, to reduce jitter caused by power supply variation. Device MP9 acts as a "kick start" to properly start up the circuit when power is first applied. The circuitry shown in the lower left region of FIG. 3B, as well as device MP6 are provided for testability, by allowing the circuit to be powered down during chip testing. Devices MN1 and MP1 generate a bias voltage that is used to bias the center frequency adjustment circuit (FIG. 4) and buffering devices in the ring oscillator.

Figure 5:
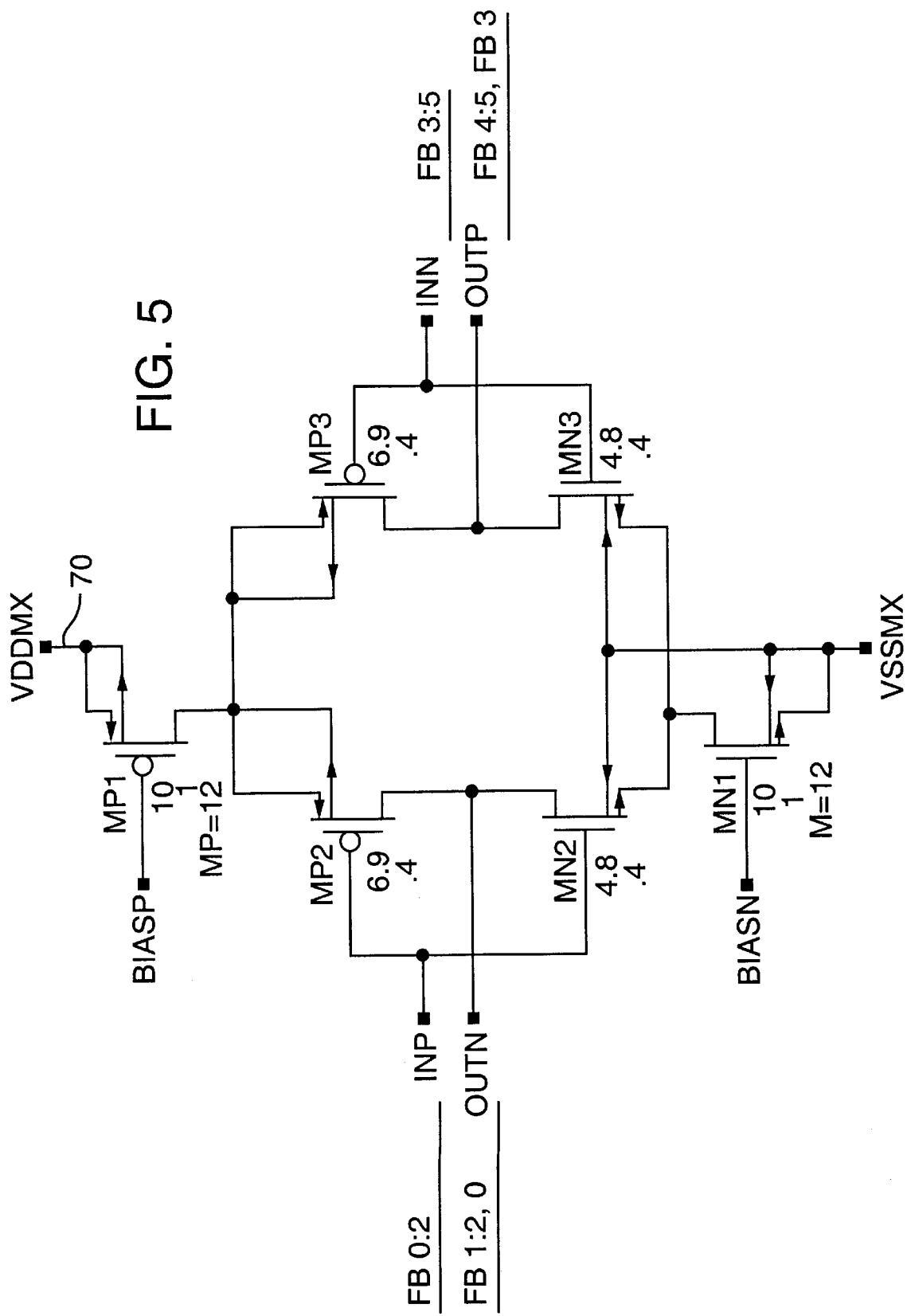
FIG. 5 is a schematic diagram of a single inverter stage of the ring oscillator portion of the VCO of FIG. 3.

FIG. 5 is a schematic diagram showing a single inverter stage of the ring oscillator (60 in FIG. 3). The ring oscillator comprises an odd number of inverter circuits, preferably three such circuits, such as the one shown in FIG. 5. The bias voltages bias P and bias N are generated as illustrated in FIG. 3B. The supply input VDDMX to each inverter circuit, as shown in FIG. 5, is connected to the OUT node 72 of FIG. 3 (also corresponding to node 34 of FIG. 3A). Operation of this inverter circuit, and ring oscillators in general, are well known and therefore omitted here.

Figure 6:
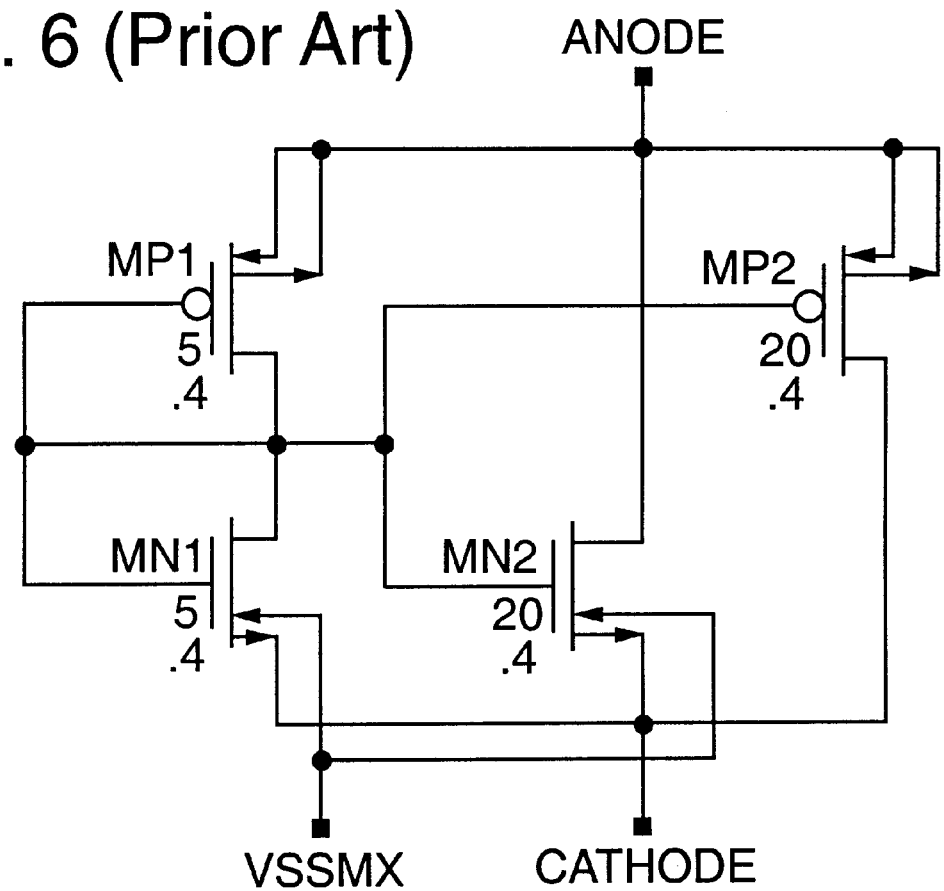
FIG. 6 is a schematic diagram of a conventional CMOS "Zener diode" useful in the VCO circuit of FIG. 3.

FIG. 6 is a schematic diagram of a conventional "Zener diode" circuit as implemented in CMOS technology. The Zener diode circuit provides a nominal predetermined voltage between the anode and cathode terminals responsive to an appropriate bias current. A Zener diode of this type can be used as the Zener diode of the circuit of FIG. 3.

FIG. 7 illustrates a serial receiver clock and data recovery circuit. A phase-locked loop (PLL) circuit comprises a VCO 112 to provide a clock signal at line 114. The clock signal from the VCO is input to a divide-by-N circuit 116 to divide it down to a fundamental or reference frequency. A reference frequency source is input at line 120 and compared to the divide-by-N clock signal in a phase-frequency detector circuit 122. If the divided clock frequency is lower than the reference frequency at line 120, the detector 122 asserts the "up" signal through multiplexer 126 to cause a charge pump 130 to increase an analog voltage VCNTL for controlling the VCO 112.

In this circuit, the VCO 112 is of the type described above with reference to FIG. 3B and FIG. 4, including a center frequency adjustment circuit as described previously. The filtered charge pump voltage is input to the VCO at line 136 to increase the clock frequency in an effort to match it to N times the reference frequency at input 120. Conversely, when the detector 122 determines that the clock frequency divided by N is greater than the reference frequency at 120, it asserts a down "DOWN" signal through MUX 126 to the charge pump 130 in order to lower the control voltage VCNTL and thereby lower the frequency output by the oscillator 112. Other particulars of operation of the serial data and clock recovery circuit are known in the prior art.

Having illustrated and described the principles of my invention in a preferred embodiment thereof, it should be readily apparent to those skilled in the art that the invention can be modified in arrangement and detail without departing from such principles. We claim all modifications coming within the spirit and scope of the accompanying claims.

I claim:

1. A voltage-controlled oscillator circuit comprising:
    a ring-oscillator comprising a serial chain of inverter circuits to provide an oscillating output signal having a desired frequency;
    a first adjustable current source coupled to the ring oscillator inverter circuits to provide biasing current so as to establish oscillation of the output signal at approximately a selected center frequency, wherein the first adjustable current source is disposed within a bias feedback loop; and
    a second adjustable current source also coupled to the ring oscillator inverter circuits to adjust the biasing current for tuning the output signal frequency in response to a control input signal.

2. A voltage-controlled oscillator circuit according to claim 1 and further comprising a digitally programmable current sink connected to the output of the first adjustable current source so as to provide a programmable load for selecting the center frequency in response to a digital input word provided to the programmable current sink.

3. A voltage-controlled oscillator circuit according to claim 2 wherein the digitally programmable current sink comprises a plurality of stages all coupled to a common output node (IOUT), each stage including an individual current sink selectable in response to a corresponding bit of the digital input word for sinking a respective current from the common output node.

4. A voltage-controlled oscillator circuit according to claim 2 wherein the bias feedback loop has a gain greater than the VCO gain.

5. A voltage-controlled oscillator circuit comprising:
    a ring-oscillator comprising a serial chain of inverter circuits to provide an oscillating output signal having a desired frequency;
    means having a selected loop gain for biasing the inverter circuits so as to establish a nominal center frequency of the output signal; and
    control means for varying the biasing applied to the inverter circuits so as to tune the frequency of the output signal in response to a control input signal.

6. A voltage-controlled oscillator circuit according to claim 5 wherein the control means for tuning the output signal has a VCO gain lower than the biasing means loop gain.

7. A voltage-controlled oscillator circuit according to claim 6 wherein the bias loop gain is on the order of approximately 10 to 100 times the VCO gain.

8. A voltage-controlled oscillator circuit according to claim 6 wherein the VCO gain is less than approximately 10 MHz per volt and the center frequency is greater than about 30 MHz, thereby implementing a low-gain, high frequency VCO.

9. A voltage-controlled oscillator circuit according to claim 5 further comprising means for adjusting the bias voltage applied to the ring oscillator and thereby adjusting the center frequency in response to an external input.

10. A voltage-controlled oscillator circuit according to claim 9 wherein the means for adjusting the bias voltage applied to the ring oscillator is responsive to a digital input word.

11. A voltage-controlled oscillator circuit according to claim 9 wherein the means for adjusting the bias voltage applied to the ring oscillator includes a digitally programmable current source.

12. A method of controlling an output signal frequency of a ring oscillator comprising the steps of:
    establishing a predetermined nominal center frequency of oscillation of the ring oscillator by providing a bias feedback loop current to the ring oscillator using a first current source; and
    controllably tuning the output signal frequency by providing a control current to the ring oscillator using a second current source, wherein the second current source but not the first current source is variable in response to a frequency control signal.

13. A method according to claim 12 wherein said providing a bias current to the ring oscillator includes providing a bias feedback loop circuit arranged for controlling the first current source to maintain the bias current at a selected value.

14. A method according to claim 12 wherein said providing a bias current to the ring oscillator includes selecting a bias feedback loop circuit loop gain of approximately on the order of 10 to 100.

15. A method according to claim 12 further comprising the step of adjusting a center frequency of the ring oscillator by controllably loading the first current source so as to controllably vary the bias current independently of the frequency control signal.

16. A method according to claim 15 wherein said controllably loading the first current source includes providing a digitally programmable current source coupled to the first current source and loading the first current source responsive to a digital input word applied to the programmable current source.

17. A method according to claim 15 wherein the digitally programmable current source comprises a plurality of individual current sources each operable in response to a corresponding bit of the digital input word.

18. A method according to claim 15 wherein said adjusting the center frequency includes measuring a center frequency of the ring oscillator; determining an adjustment load current necessary for changing the center frequency to a desired center frequency; and then applying to the programmable current source a selected digital input word corresponding to the adjustment load current; whereby a desired center frequency is attained while overcoming fabrication process variations.

19. A method according to claim 18 and further comprising storing the selected digital input word so as to provide for continuous operation of the ring oscillator at the desired center frequency.

20. A method according to claim 19 wherein said storing the selected digital input word includes storing the input word on board an integrated circuit together with the digitally programmable current source.

21. A method according to claim 19 further comprising providing a non-volatile memory on board the integrated circuit and wherein said storing the selected digital input word includes storing the input word in the non-volatile memory whereby said steps of measuring the center frequency and determining an adjustment load current necessary for changing the center frequency to the desired center frequency need not be repeated.

* * * * *